United States Patent
Knowles

(10) Patent No.: US 7,718,979 B2
(45) Date of Patent: May 18, 2010

(54) PARTICLE-OPTICAL APPARATUS FOR SIMULTANEOUS OBSERVING A SAMPLE WITH PARTICLES AND PHOTONS

(75) Inventor: William Ralph Knowles, Forest Grove, OR (US)

(73) Assignee: FEI Company, Hillsboro, OR (US)

( * ) Notice: Subject to any disclaimer, the term of this patent is extended or adjusted under 35 U.S.C. 154(b) by 352 days.

(21) Appl. No.: 12/027,245

(22) Filed: Feb. 6, 2008

(65) Prior Publication Data

US 2008/0185509 A1    Aug. 7, 2008

Related U.S. Application Data

(60) Provisional application No. 60/900,005, filed on Feb. 6, 2007.

(51) Int. Cl.
*A61N 5/00* (2006.01)
(52) U.S. Cl. .................. 250/492.1; 250/492.3
(58) Field of Classification Search ............... None
See application file for complete search history.

(56) References Cited

U.S. PATENT DOCUMENTS

| | | | |
|---|---|---|---|
| 4,823,006 A | 4/1989 | Danilatos et al. | |
| 5,362,964 A | 11/1994 | Knowles et al. | |
| 5,500,528 A | 3/1996 | Matsui et al. | |
| 5,591,970 A * | 1/1997 | Komano et al. | 850/12 |
| 6,348,689 B1 * | 2/2002 | Koyama | 850/43 |
| 6,373,070 B1 * | 4/2002 | Rasmussen | 250/492.21 |
| 6,885,445 B2 | 4/2005 | Bennett et al. | |
| 7,045,791 B2 * | 5/2006 | Benas-Sayag et al. | 250/396 R |
| 7,297,948 B2 * | 11/2007 | Benas-Sayag et al. | 250/306 |
| 7,589,322 B2 * | 9/2009 | Nishikata et al. | 250/310 |
| 2003/0215060 A1 * | 11/2003 | Ohzawa | 378/154 |

(Continued)

FOREIGN PATENT DOCUMENTS

EP     1724809     11/2006

OTHER PUBLICATIONS

Moncrieff, D.A. et al., Electron Scattering by gas in the scanning electron microscope, J. Phys. D: Appl. Phys, 1978, vol. 12, pp. 481-488.

(Continued)

*Primary Examiner*—Bernard E Souw
*Assistant Examiner*—Andrew Smyth
(74) *Attorney, Agent, or Firm*—Scheinberg & Griner, LLP; Michael O. Scheinberg; David Griner

(57) ABSTRACT

A particle-optical apparatus, such as an ESEM®, for simultaneous observing a sample with particles and photons. A pressure limiting aperture (PLA) is placed in a diaphragm between the objective lens of the ESEM® and the sample position. The distance between the sample position and the aperture is sufficiently small to allow a large collection angle of the photons through this aperture. A mirror is placed between the diaphragm and the objective lens. Due to the large collection angle for photons a large NA is achieved. The small distance between sample position and aperture also result in less scattering of electrons than occurs in ESEM's where a mirror is placed between aperture and sample position, as the electrons have to travel through only a limited length in a high pressure area. Embodiments describe combinations where e.g. an immersion lens is used.

25 Claims, 2 Drawing Sheets

U.S. PATENT DOCUMENTS

2007/0115468 A1* 5/2007 Barnard .................... 356/300

OTHER PUBLICATIONS

Mathieu, C., The beam-gas and signal-gas interactions in the variable pressure scanning electron microscope, Scanning Microscopy, 1999, vol. 13, No. 1, pp. 23-41.

Newbury, D. E., X-ray microanalysis in the variable pressure (environmental) scanning electron microscope, J. Res. Natl. Inst. Stand. Techn., 2002, vol. 107, pp. 567-603.

SX 100 Electron Probe MicroAnalyzer, CAMECA Science & Metrology Solutions.

* cited by examiner

PARTICLE-OPTICAL APPARATUS FOR SIMULTANEOUS OBSERVING A SAMPLE WITH PARTICLES AND PHOTONS

This Application claims priority from U.S. Provisional Application No. 60/009,005, filed Feb. 6, 2008, which is hereby incorporated by reference.

BACKGROUND OF THE INVENTION

The invention relates to a particle-optical apparatus comprising: a vacuum chamber, an particle-optical column mounted on the vacuum chamber for producing a particle beam round a particle-optical axis, said particle-optical column comprising a particle source, a sample carrier located in the vacuum chamber for carrying a sample at a sample position, said sample position located on the particle-optical axis, a mirror collecting light emitted from the sample position or focussing light on the sample position, said mirror showing a through-hole round the particle-optical axis, and evacuation means for evacuating the apparatus.

The invention also relates to a kit for upgrading an existing apparatus, and to a method for using such an apparatus.

Such an apparatus is known from U.S. Pat. No. 6,885,445 B2.

Such apparatus are used in industry and research, e.g. for the analysis and modification of samples, such as samples taken from semiconductor wafers or e.g. biological samples.

Such an apparatus can be used to irradiate a sample with a beam of particles, such as a beam of electrons or ions. Particle-optical columns producing such beams are known per se from use in Scanning Electron Microscopes (SEM), Focused Ion Beam apparatus (FIB), Scanning Transmission Electron Microscopes (STEM), Electron Microprobes, etc.

As known to the person skilled in the art, images may be obtained by irradiating the sample with a finely focused beam of particles such as electrons, which beam is scanned over the sample. This irradiation causes secondary particles and radiation to emanate from the sample, which particles and radiation can be detected by suitable detectors. As the beam is finely focused and scanned over the sample, the signal detected by the detectors is place dependent. The signal can be converted to an image, e.g. by placing it in a computer memory, after which the data of this memory can be displayed on a display. It is also possible to perform certain analysis on the data in the computer memory and display the outcome of these analysis.

For certain applications it is necessary to irradiate the sample placed in such an apparatus in situ with a beam of light, e.g. to cause heating or to cause chemical changes in the sample. In other cases there is a need to detect light emitted by the sample, e.g. in response to the irradiation with the beam of particles (cathodoluminescence), or in response to irradiation with light (e.g. Raman spectroscopy. FRET (Fluorescent Resonant Energy Transfer), or FLIM (Fluorescent Lifetime IMaging)).

In both cases the sample is irradiated with a particle beam, while a path of light must be present between the sample and e.g. a detector or a generator of light. Also techniques where the sample is simultaneously illuminated by light and photons emanating from the sample are analysed/detected can be envisaged, where e.g. a beam splitter is used to split the path of incoming and outgoing photons.

The known apparatus comprises a particle-optical column showing a particle-optical axis. A sample can be positioned on a sample position at the particle-optical axis. A mirror is placed between the particle-optical column and the sample position. The mirror has a through-hole for passing the particle-beam. Between the mirror the light-optical axis and the particle-optical axis coincide. The mirror, e.g. a parabolic mirror, deflects the light-optical axis over an angle of e.g. 90°, while leaving the particle-optical axis unchanged. As a result e.g. a light-optical detector and/or a generator of light such as a laser, LED or conventional lamp do not interfere with the volume taken up by the particle-optical column and associated detectors, such as a secondary particle detector or an X-ray detector. When using this apparatus for e.g. Raman spectroscopy the numerical aperture of the optical path as defined by the mirror must be large, as the signal is rather weak.

As known to a person skilled in the art, charged particles are easily scattered when travelling through a (rarefied) gas. For that reason the volume through which the charged particles travel in a particle-optical column is normally evacuated to a pressure lower than e.g. $10^{-4}$ mbar to avoid scattering.

A problem occurring at such low pressures is that the sample dehydrates, leading to artefacts. Obviously this effect will not take place, at least not to such an extent, when the sample is placed in a vacuum in which water vapour is present. This implies a vacuum with a pressure equal to or exceeding the equilibrium pressure of water vapour.

Instruments are known in which the sample is observed in a vacuum of e.g. 8 mbar, being the equilibrium pressure of water at a temperature of 4° C. Such instruments are commonly known as Environmental Scanning Electron Microscope (ESEM®) or Variable Pressure Scanning Electron Microscope (VP-SEM).

A known limitation of such instruments is that many particles are scattered out of the primary beam of particles into the so-named skirt region. This is described in "Electron Scattering by gas in the scanning electron microscope", D. A. Moncrieff et al., J. Phys. D: Appl. Phys, Vol. 12 (1979), p 481-488, further referred to as Moncrieff. Moncrieff describes in section 4 (discussion and conclusion) that under the conditions of an electron beam energy of 25 keV and a working distance of 15 mm of nitrogen gas at a pressure of 1 mbar, 60% of the electrons are scattered out of the beam. This implies that only 40% of the particles arrive at the intended position.

FIG. 5 of Moncrieff shows that at a pressure of 10 mbar and a working distance of approximately 4 mm already more than 90% of the particles are scattered. Later work described in "The beam-gas and signal-gas interactions in the variable pressure scanning electron microscope", C. Mathieu, Scanning Microscopy, Vol. 13, No. 1 (1999), pages 23-44 show that the scattering effect is even more severe at lower beam energies.

"X-ray microanalysis in the variable pressure (environmental) scanning electron microscope", D. E. Newbury, J. Res. Natl. Inst. Stand. Techn., Vol 107 (2002), pages 567-603, further referred to as Newbury, describes that the signal detected (in this case by an X-ray detector) is the combination of the signal caused by the non-scattered particles and the signal caused by the scattered particles. As the scattered particles can impinge on the sample in the skirt region, removed from the intended position (the focus of the beam of unscattered particles), a signal is generated both by the unscattered particles carrying information about the intended position and by the scattered particles carrying information about the skirt regions. The signal caused by the scattered particles thus 'pollutes' the signal caused by the unscattered particles, which may give rise to artefacts, i.e. show the presence of materials at the intended position while these materials are in reality not present at that position, but somewhere in the skirt region. As the fraction of scattered particles rises, the effect becomes stronger.

Although Newbury describes this effect for X-ray microanalysis, it is clear that this effect also occurs when detecting photons coming from the sample, e.g. detecting cathodoluminescense from the sample.

As described in Newbury (page 572, left column), a related problem is the lowering of the signal-to-noise ratio S/N of the signal obtained with e.g. the secondary particle detector. This can be explained as follows: the current density in the unscattered part of the beam is high when compared to the current density in the scattered part. The unscattered particles give a signal with a high spatial resolution, while the scattered particles give a signal with a much lower spatial resolution, as the skirt region is much larger. Therefore, even when most of the particles are scattered, the place dependency of the combined signal is sufficient to obtain resolution. However, as less and less particles are available in the unscattered part of the beam, the signal caused by this part of the beam will drop accordingly. A lowering of the S/N is thus the effect.

The effect of scattering is not discussed in U.S. Pat. No. 6,885,445 B2.

Practical marketed systems for performing e.g. Raman spectroscopy, Fluorescent Microscopy (FM), Fluorescent Resonant Energy Transfer (FRET) or Fluorescent Lifetime IMaging (FLIM) in conjunction with an ESEM® typically use a distance of approximately 10 mm between the mirror and the sample position due to the minimum practical size of the mirror while obtaining a large collection angle (a high numerical aperture N.A. of e.g. N.A.>0.24) for light. At a pressure of 8 mbar more than 90% of the particle of a 25 kV particle beam would thus be scattered out of the beam into the skirt region (see Moncrieff, FIG. 5). Most of the signal detected is thus coming from the skirt region, and not from the intended focus. This would lead to a large deterioration of the S/N ratio of the signal obtained by the particle-optical column, and would also lead to most of the signal coming from the skirt region on the sample instead of from the intended region: the focus of the unscattered beam A disadvantage of such a system is thus the problems associated with the scattering of particles from the particle beam at elevated pressures of e.g. 8 mbar.

There is thus a need for a particle-optical apparatus of the kind disclosed in U.S. Pat. No. 6,885,445 B2, showing a lower scattering of the particles of the particle beam at elevated pressures.

It is an object of the invention to provide such an apparatus.

BRIEF SUMMARY OF THE INVENTION

The invention relates to a particle-optical apparatus, such as an ESEM®, for simultaneous observing a sample with particles and photons. A pressure limiting aperture (PLA) is placed in a diaphragm between the objective lens of the ESEM® and the sample position. The distance between the sample position and the aperture is sufficiently small to allow a large collection angle of the photons through this aperture. A mirror is placed between the diaphragm and the objective lens. Due to the large collection angle for photons a large NA is achieved. The small distance between sample position and aperture also result in less scattering of electrons than occurs in ESEM's where a mirror is placed between aperture and sample position, as the electrons have to travel through only a limited length in a high pressure area. Embodiments describe combinations where e.g. an immersion lens is used.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

BRIEF DESCRIPTION OF PREFERRED EMBODIMENTS

Figure 1:
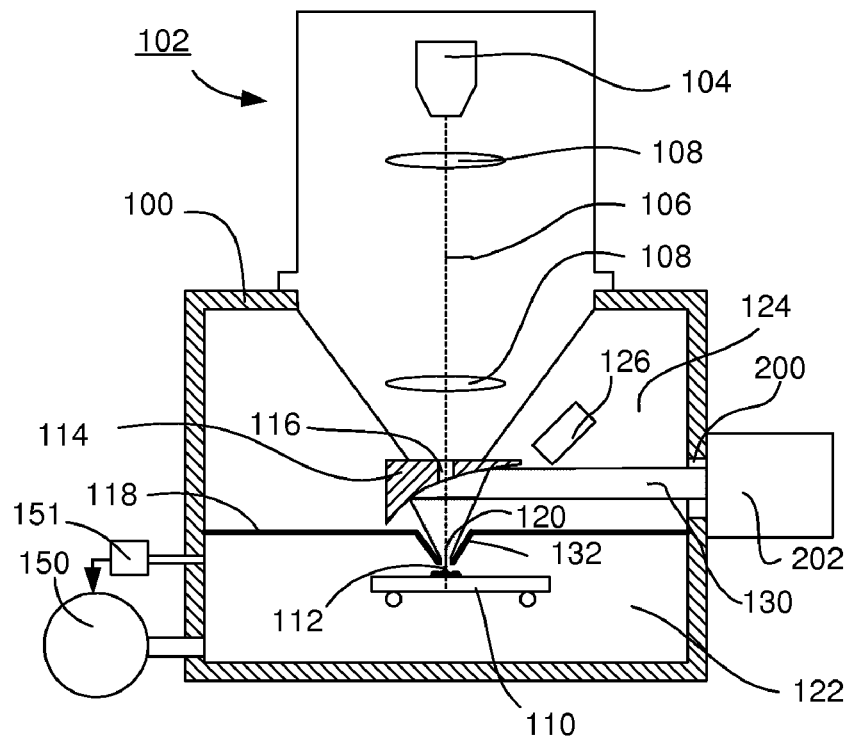
FIG. 1 shows an apparatus according to a first embodiment of the invention.

To that end the apparatus according to the invention is characterized in that a diaphragm is placed between the sample position and the mirror, said diaphragm dividing a first volume in which the sample position is located from a second volume, said diaphragm showing an aperture round the particle-optical axis for passing particles produced by the particle-optical column and for passing light between the mirror and the sample position, the aperture limiting the gas flow from the first volume to the second volume to such a value, that, when the pressure at the sample position is the equilibrium pressure of a fluid with an equilibrium pressure above 1 mbar, the evacuation means can evacuate the second vacuum to a pressure sufficiently low to cause negligible scattering of the particle beam in the second volume when compared to the scattering in the first volume, and the distance between the aperture and the sample position can be adjusted to be, or is fixed at, less than four times, preferably less than twice, the diameter of the aperture.

By placing a diaphragm between the sample position and the mirror it is possible to have different pressures in the first and the second volume. The aperture limits the gas flow such that the pumping means can evacuate the second volume to such a value that scattering of the particle beam in that volume is negligible. In the before mentioned ESEM® this is realized by an aperture diameter of e.g. less than 1 mm. A larger diameter of the aperture would lead to a gas flow too large to evacuate with the evacuation means normally used in such apparatus, such as oil diffusion pumps, rotary pumps, turbomolecular pumps, membrane pumps, drag pumps, etc.

Only in the area between sample position and aperture the particles encounter a pressure sufficiently high to cause significant scattering. However, due to the small length that the particles have to travel through this high pressure, scattering is limited, as scattering is dependent on the length the particle travel through the gas. Also the diameter of the skirt region is limited, as on average scattering is taking place closer to the surface of the sample, resulting (at a given scatter angle) in a smaller distance between the position where the scattered particle impinges and the position where the unscattered particles impinge.

It is remarked that another reason for choosing the diameter of the aperture less than 1 mm is that, when travelling from the sample position from the first volume through the aperture to the second volume, the change in gas pressure is not an abrupt change, but occurs over a length of approximately one diameter. Over approximately this length the pressure is thus already sufficiently high to cause significant scattering of the particle beam.

It is further remarked that the sample is best placed at a distance from the aperture where the pressure does not differ too much from the pressure at other places in the first volume to avoid e.g. dehydration. If the sample is placed too close to the aperture, the pressure in the direct vicinity of the aperture will be lower than the pressure elsewhere, and dehydration could result, even when the pressure in the first volume is controlled such that e.g. water vapour is present. As a rule of thumb the sample is best placed at a distance of more than approximately half the diameter of the aperture.

If the distance between sample position and aperture is sufficiently small, it is possible to collect light coming from the sample through the aperture, even when the aperture has a rather small diameter of e.g. 1 mm. To achieve a high numerical aperture N.A., e.g. a N.A. >0.24, a distance between sample position and aperture of less than twice the diameter of the aperture is necessary. The mirror can now be placed between the aperture and the particle source, which offers sufficient space for a mirror with a dimension that can be easily realized.

It is remarked that, for many applications, a numerical aperture of less than 0.1 would be unacceptable. Therefore a distance of less than four times the diameter of the aperture, preferably less than twice is a characterisation of the apparatus according to the invention. A distance of about one to two times the diameter of the aperture seems to be a 'sweet spot', giving a good match between the numerical aperture NA and a good predictability of the pressure at the sample position. A distance larger than twice the diameter of the aperture, between twice and four times the diameter of the aperture, might however be advantageous when a slightly larger distance is needed, e.g. due to the shape of the sample (to avoid contact of the sample with the diaphragm), or e.g. when this is necessary to give the particle-optical column a larger field-of-view, or to allow detectors to observe the sample.

It is remarked that, as mentioned before, so limiting the gas flow in a SEM is known. This principle, described in U.S. Pat. No. 4,823,006 B2, is used in e.g. Environmental Scanning Electron Microscopes (ESEM®), commercially available from FEI Company, Hillsboro, USA. U.S. Pat. No. 4,823,006 B2 describes an aperture (or apertures) dividing a low vacuum area [equivalent to volume 1] and a high vacuum area [equivalent to volume 2], where the aperture (or apertures) restrict the gas flow between the two areas, thereby enabling vacuum pumps to achieve a pressure sufficiently low to cause negligible electron scattering in the high vacuum area, while the other side is at e.g. 20 mbar (the equilibrium pressure of water at room temperature). According to U.S. Pat. No. 4,823,006 the diameter of such an aperture is preferably between 50 µm and 1 mm. A typical value is 0.2 mm or less to achieve sufficient gas restriction.

The introduction of the mirror of U.S. Pat. No. 6,885,445 B2 would however lead to an increase of the distance between the sample position and the aperture dividing the high vacuum and the low vacuum areas. This increased distance would in turn result in increased scattering of the beam.

An improvement would be to mount the aperture(s) described in U.S. Pat. No. 4,823,006 in the mirror of U.S. Pat. No. 6,885,445. However, a sample being investigated or the mount on which it is mounted often extends in a plane perpendicular to the particle-optical axis. The (concave) mirror at one end then bends towards the sample or its mount. To allow some clearance between the mirror and the sample the distance between the aperture(s) and the sample position would be more than twice the diameter of aperture (typically less than twice the diameter of approximately 0.2 mm), thus still resulting in a longer path in which the particle beam is scattered, and thus more scattering than in the apparatus according to the invention.

It is further remarked that an instrument is known from U.S. Pat. No. 7,045,791 B2. In the described instrument a particle-optical column comprises a diaphragm transparent for light near a sample position. The transparent diaphragm shows an electrode with an aperture through which the particle beam can pass. The transparent diaphragm is placed between the sample position and a mirror, the mirror showing a through-hole for passing the particle beam. Herewith an optical path coaxial to the particle-optical axis through the transparent diaphragm is realized, the light optical path to be deflected from the particle-optical axis by either said mirror or other light-optical elements. This instrument is thus characterised in that the particles of the particle-optical column have a path through the aperture, while the light has a path through the transparent diaphragm, outside the electrode in which the aperture is formed.

U.S. Pat. No. 7,045,791 B2 does not disclose a minimum distance between aperture and sample position, nor a diameter of the aperture. Also, the solid angle under which the transparent diaphragm (formed around the aperture) is seen is severely limited, which would result in an inferior numerical aperture N.A. in the light path and thus an inferior solution from a light-optical point of view, even if the aperture were used to limit gas flow and minimize scattering.

In an embodiment of the apparatus the diameter of the aperture is less than 1 mm, more specifically less than 300 µm.

As discussed before, the diameter of the aperture needs to be sufficiently small to limit the gas flow from the first volume to the second volume. US Pat. No. 4,823,006 B2 describes an aperture diameter of less than 1 mm, typically 200 µm.

In another embodiment of an apparatus according to the invention the evacuation means can evacuate the second volume to a pressure sufficiently low to cause negligible scattering of the particle beam when the pressure in the first volume is above approximately 6 mbar.

With evacuation means such as vacuum pumps used in electron microscopes (oil diffusion pumps, rotary pumps, turbo-molecular pumps, membrane pumps, drag pumps, etc.) sufficient pumping can be achieved to evacuate the second volume to a pressure of e.g. 0.1 mbar, at which pressure the scattering is much reduced or negligible when compared to the scattering that occurs in the first vacuum. As water at a temperature of 0° C. has an equilibrium pressure of approximately 6 mbar, a pressure equal to or exceeding this pressure enables observation and/or analysis of wet samples.

In yet another embodiment of an apparatus according to the invention the apparatus further comprises a charged particle detector, said detector located at the side of the diaphragm opposite to the sample position (in the second volume).

Such a detector may be used to detect ions or electrons emanating from the sample. Detectors of this kind are well-known, such as the Everhart-Thornley detector. By locating the detector in the second volume, no extra distance between sample position and diaphragm will be necessary. Due to the large acceptance angle under which the aperture is seen from the sample position (necessary for a high numerical aperture N.A.), the charged particles can be easily extracted from the sample position to the second volume, e.g. by an electric field present at the side of the aperture opposite to the sample position and protruding through the aperture.

In yet another embodiment of an apparatus according to the invention the apparatus further comprises a charged particle detector, said detector located in the first volume.

Certain charged particle detectors, such as a solid state backscattered electron detector can easily be mounted under the diaphragm. Such a detector is e.g. a thin P-I-N diode. Also detectors of other types, such as X-ray detectors, can be mounted in the first volume.

In yet another embodiment of an apparatus according to the invention the apparatus further comprises a charged particle detector, said diaphragm being part of the charged particle detector.

The diaphragm can be part of the charged particle detector, for example when the aperture is formed in a P-I-N diode and this diode is (a part of) the diaphragm.

In still another embodiment of the apparatus according to the invention the apparatus further comprises a photon detector.

Such a photon detector, detecting light emanating from the sample, can be used to detect cathodoluminescence. The detector may e.g. be part of a Raman spectrometer. The photon detector can also be used to detect the radiation coming from fluorescent labels as used in e.g. biological markers, where said markers attach to specific structures in biological tissues. The fluorescence can be induced by illumination with light, but can also be induced by irradiation with the particle beam.

In a further embodiment of the apparatus according to the invention in which the apparatus is equipped with a light block, said light block showing a hole for passing light, the mirror imaging the sample position on the hole, so that light emanating from other places than the sample position does not significantly contribute to the amount of light detected by the photon detector.

By imaging the sample position on the hole, light emanating from the sample position may pass through the hole unobstructed. Light generated elsewhere (stray light) will in most cases not be imaged onto the hole, and will thus be blocked by the light block. This method of imaging is known from confocal microscopy. Such 'false light' can e.g. be light generated due to charged particles interacting with gas molecules (inelastic collisions), but it can also be e.g. light in the form of infrared radiation coming from hot spots somewhere in the vacuum chamber, or e.g. light coming from a LED in a position measuring device mounted in the vacuum chamber. Also light coming from other parts of the sample may be blocked by the light block.

In another embodiment of the apparatus according to the invention in which the apparatus is equipped with a gas injector, said gas injector admitting gas or vapour to the vacuum chamber.

Admission of gas at pressures between e.g. 1 and e.g. 10 mbar find its application in e.g. deposition of material on a sample or etching material from a sample with a charged particle beam.

In still another embodiment of the apparatus according to the invention in which the diaphragm shows a protrusion in the form of a truncated cone pointing to the sample position, and where the aperture is formed in the end of the cone closest to the sample position.

The protrusion enables the aperture to be placed close to the sample position, while enabling e.g. tilting of the sample, or the analysis of a concave part of the sample without parts of the sample touching the diaphragm.

In yet another embodiment of the apparatus according to the invention the light is formed by photons from the group of infra-red, visible light, ultra-violet and X-ray photons.

In still another embodiment of the apparatus according to the invention in which a pole piece of a particle-optical lens is situated between the sample position and the mirror.

Particle-optical lenses, such as magnetic or electrostatic lenses, comprise so-named pole pieces, guiding the magnetic and/or electric fields used in these lenses. Such a pole piece is often a metal member showing rotation symmetry. In this embodiment the pole piece is placed between mirror and the sample position, which implies that the mirror is situated within the particle-optical column. This embodiment implies that the mirror is placed inside the particle-optical column.

In a further embodiment of the apparatus according to the invention the pole piece is the diaphragm.

This embodiment is especially attractive in the case where the particle-optical column is equipped with e.g. a snorkel lens. As known to the person skilled in the art a snorkel lens employs a pole piece close to the sample position.

In yet another embodiment of the apparatus according to the invention the mirror is located between the particle-optical column and the aperture.

In an aspect of the invention a method of operating a particle-optical apparatus comprises: providing an apparatus according to any of the preceding claims, mounting a sample at the sample position, evacuating the first volume to a pressure between 1-50 mbar, evacuating the second volume to a pressure below 0.1 mbar, more specifically to a pressure below 0.01 mbar, adjusting the distance between the sample and the aperture to a distance less than twice the diameter of the aperture, passing a beam of particles through the aperture and passing a beam of photons through the aperture.

In a further embodiment of the method according to the invention the beam of photons emanate from the sample.

In another embodiment of the method according to the invention the beam of photons is focused on the sample.

In yet another embodiment of the method according to the invention the first volume is evacuated to a pressure below 20 mbar, more specifically to a pressure below 10 mbar.

In still another embodiment of the method according to the invention the first volume is evacuated to a pressure above 6 mbar.

6 mbar is the equilibrium pressure of water at its freezing point.

The invention is now elucidated with the help of figures, where identical numerals refer to identical features.

FIG. 1 shows an apparatus according to a first embodiment of the invention. It shows a vacuum chamber 100 on which a particle optical column 102 is placed. The particle-optical column comprises a particle source 104, emitting particles round a particle-optical axis 106, and particle-optical lenses 108. As known to the person skilled in the art the column may further comprise further particle-optical lenses, deflectors, multipoles, etc. It is remarked that, although FIG. 1 shows a column with two lenses, columns are known with one, three and more lenses. The column can be evacuated by evacuation means (not shown), such as oil diffusion pumps, rotary pumps, turbo-molecular pumps, membrane pumps, drag pumps, etc., as well as combinations thereof.

In the vacuum chamber a sample carrier 110 is placed, on which a sample 112 may be placed. The sample carrier is equipped to position the sample with respect to the optical axis, including a positioning along the optical axis. Often such sample carriers can also tilt and/or rotate the sample with respect to the optical axis.

A diaphragm 118 divides the vacuum chamber in two volumes 122, 124. The first volume, 122, is evacuated to a pressure of e.g. 5 mbar, while the pressure of the second volume 124 is evacuated to a pressure below e.g. 0.1 mbar, at which pressure negligible scattering of the particle beam travelling from the particle source to the sample occurs. The diaphragm shows an aperture 120, which is sufficiently small to limit the gas flow to such a value that the pressure of e.g. 0.1 mbar in the second volume can be maintained. The first volume 124 can be evacuated with a vacuum pump 150, controlled by a vacuum controller 151 so that the pressure is the required pressure. It is remarked that it is also possible to regulate an amount of a fluid such as water vapour to enter the vacuum chamber, thereby regulating the pressure in vacuum chamber 100 (assuming limited pumping capacity of pump 150). The second volume 122 can have similar pumping means, but is evacuated to a lower pressure. Several set-ups for evacuating the first and the second volume, as well as the column, are used in ESEM's and are known to the person skilled in the art per se.

The diaphragm 118 is equipped with a protruding cone 132. This makes it possible to use samples that are not flat or to tilt the sample (by tilting the sample carrier), without the sample touching the diaphragm.

In the second volume 122 a mirror 114 is located around the particle-optical axis 106. The mirror shows a through-hole 116 through which the particles can travel from the particle source 104 to the sample. Between the mirror and the sample the particle-optical axis and the light-optical axis coincide. Seen from the sample the mirror deflects the light-optical axis from the particle-optical axis. The second volume further contains a detector 126 for detecting secondary particles emanating from the sample, such as secondary electrons.

The vacuum chamber 100 is equipped with an hermetically sealed optically transparent window 200, enabling light coming from the sample via the mirror 114 to enter a detector located in module 202, or vice versa a beam of light 130 coming from a light source located in module 202 to irradiate the sample. It is remarked that it is also possible to locate the module 202 inside the vacuum chamber, or—assuming the housing of that module is hermetically sealed—to implement the window as a through-hole, leaving the inside of the module exposed to vacuum.

In operation the particle source 104 generates a beam of particles, e.g. electrons or ions with an energy of e.g. 0.1-30 keV. As known to the person skilled in the art this beam can be focused on the sample with the help of the particle-optical lenses 108, and may be scanned over the surface of the sample with the aid of deflectors (not shown), manipulating the beam with magnetic or electric fields. The resultant irradiation of the sample with the beam of particles will generate secondary radiation, such as secondary electrons, backscattered electrons, ions, X-ray of photons. The secondary electrons and ions can be detected with a suitable detector, such as detector 126, which may be of the Everhart-Thornley type. Also X-ray detectors are well known to the person skilled in the art. Light coming from the sample is collected by the mirror 114 and deflected to a photon detector housed in module 202. To that end the mirror is preferably a parabolic mirror or an elliptical mirror, imaging the position where the particles impinge on the sample, as a result of which photons emanate from that position, on the photon detector.

The pressure between the aperture 120 and the sample, e.g. 6 mbar, is so high, that some scattering of the particle beam occurs. However, by choosing the distance between aperture and sample small, the effect of scattering is limited. Therefore most information gathered by the detectors, be it secondary particles, X-ray or light, will find its origin in the focus of the beam of particles. The distance between the sample and the aperture can be adjusted to the required small value by positioning the sample carrier 110 along the particle-optical axis.

The obtained small distance also implies that the opening angle for the light-optical path shows a relatively large numerical aperture, resulting in an efficient gathering of the photons coming from the sample.

It is also possible to focus photons coming from module 202, e.g. generated by a laser, thereby heating the sample or otherwise causing e.g. chemical or physical changes.

Figure 2:
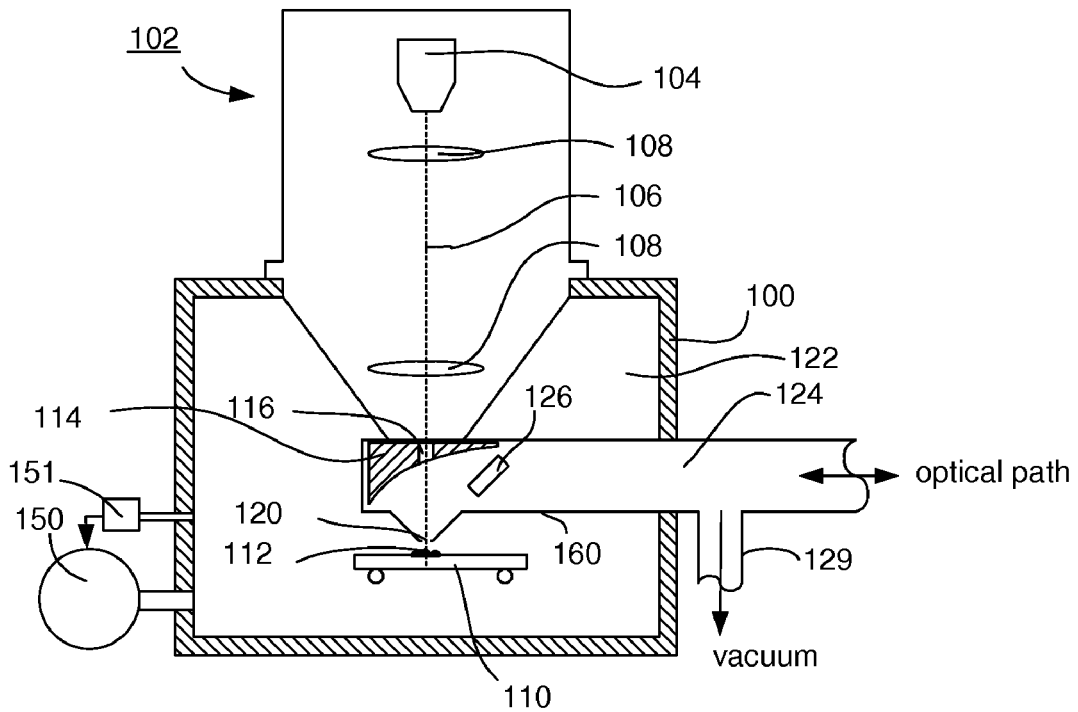
FIG. 2 shows another embodiment of the invention, in which the second volume is formed as a tube.

FIG. 2 shows another embodiment of the invention, in which the second volume is formed as a tube.

FIG. 2 can be thought to be derived from FIG. 1. Here however the second vacuum is formed as a tube 160 placed at an angle to the particle-optical axis 106 (tube 160 is shown here perpendicular to the particle-optical axis). One end of the tube shows two through-holes, one sealing against the particle-optical column 102, the other being the aperture 120 close to the sample position. The through-holes are placed such that the particle beam passes through both. The mirror 114 is placed between these two holes, deflecting the light-optical axis along the tube 118. The other end of the tube is connected to e.g. a photon detector or photon generator (not shown).

The tube is evacuated by pumping means connected to the tube via a vacuum tube 129.

The inside of the tube, which constitutes the second volume 124, is evacuated to a pressure of e.g. 0.1 mbar, at which pressure scattering is negligible. As the tube seals to the particle-optical column 102, the vacuum between tube and particle source can be kept at this or an even lower pressure. Only between the sample 112 and aperture 120 is the pressure so high that substantial scattering occurs. By adjusting the distance between this aperture and the sample to the before mentioned small distance, the effect of scattering is limited.

By making the tube 118 retractable, this embodiment is especially convenient when there is a need for an apparatus that can either operate according to the invention or as a standard ESEM®, where e.g. more space is available for other types of detectors or other types of samples.

This embodiment also enables a simple kit for upgrading e.g. a standard SEM or ESEM® to an apparatus according to the invention.

Figure 3:
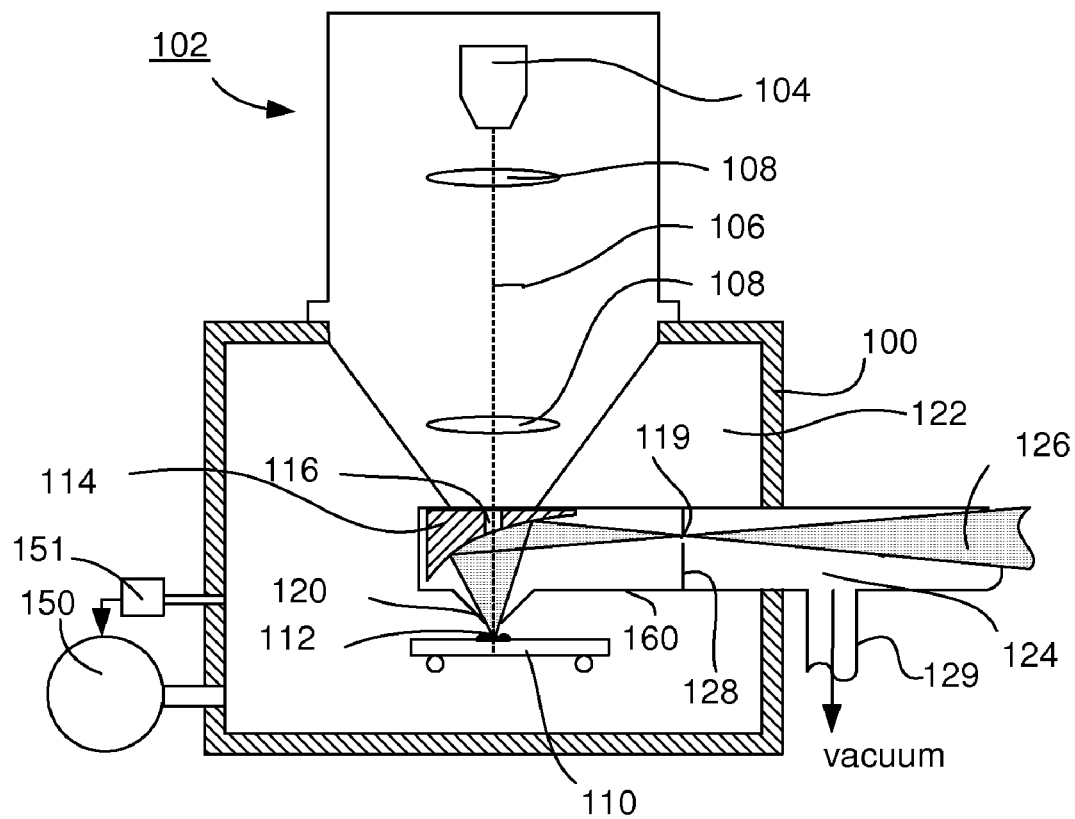
FIG. 3 shows an embodiment of the apparatus according to the invention in which a light block is present in the optical path.

FIG. 3 shows an embodiment of the apparatus according to the invention in which a light block is present in the optical path.

FIG. 3 can be thought to be derived from FIG. 2. Here, however, the mirror focuses the light coming from the sample position onto a light block 128. The light block shows a pinhole 119 through which the light coming from the sample position 112 can travel to a detector unit (not shown). The mirror 114 does not image light coming from other positions at the pinhole in the light block, so that this light will not be transmitted to the detector unit.

It is remarked that, although the light block needs to block light, in the shown configuration it needs to have a relatively large pumping conductance as well. This can be realized by equipping the light block as a labyrinth, or by making the connection between the vacuum tube 129 and tube 119 between the mirror and the light block.

This embodiment is particularly useful to eliminate the detection of e.g. stray light, such as light coming from other detector systems or light generated due to inelastic scattering of particles with gas molecules.

Figure 4:
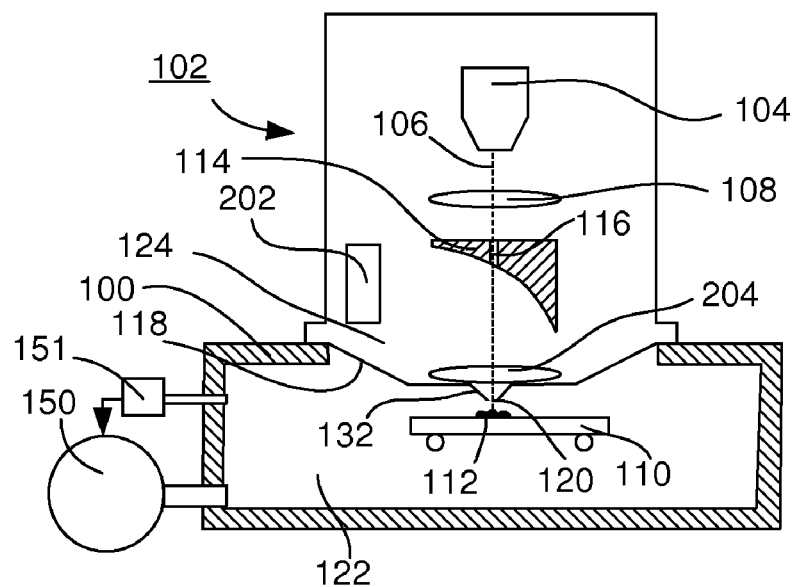
FIG. 4 shows a preferred embodiment of the apparatus according to the invention in which a pole piece is located between the mirror and the sample position.

FIG. 4 shows a preferred embodiment of the apparatus according to the invention in which a pole piece is located between the mirror and the sample position.

FIG. 4 shows the mirror 114 being located between the particle-optical lenses 108 and 204 of the particle-optical column 102. Particle optical lens 204, the so-named objective lens, can e.g. be a conventional magnetic or electrostatic particle-optical lens, or it can be a so-named immersion lens—where the sample is placed in the magnetic or electric field of the objective lens—, both types of lenses well known to the person skilled in the art. The part of the column facing the sample position 112, formed as a pole piece of the objective lens 204, comprises the aperture 120 (passing both the particles and the photons), thereby also separating the first and the second volume. The mirror 114 deflects the light-optical axis from the particle-optical axis towards a detector module 202. This module is here shown inside the vacuum of the particle-optical column, but can also be placed outside the column, provided that the particle-optical column 102 shows a window for passing the photons.

This embodiment is especially attractive as it uses an objective lens 204 with a small distance between pole piece and sample position, which—as known to the person skilled in the art—results in the best optical performance of this lens.

Another advantage of this embodiment is the resultant compact design.

It is remarked that, although in the figure the mirror 114 is shown to be placed outside the objective lens 204, it is possible to mount the mirror between the pole pieces of the objective lens. As the gap between the pole pieces of the objective lens 204 is quite close to the sample position, this results in a position of the mirror 114 close to the sample and thus a mirror with smaller dimensions can be used than when the mirror is placed outside the objective lens (at the side of the particle source).

It is further remarked that, by using an objective lens 204 of the immersion type an apparatus combining a high particle-optical performance and a high numerical aperture for the optical path can be constructed. As known to the person skilled in the art an immersion lens requires a small distance between its lens pole and the sample. Assuming that the central bore of the lens pole acts as aperture 120, this aperture is thus also well positioned for passing photons between sample and mirror. Placing the mirror between the pole piece of an immersion lens and the sample might even be impossible, so that this embodiment may be the preferred solution when using an immersion lens to attain high particle-optical resolution.

It is remarked that in the aforementioned embodiments the distance between the sample position 112 and the aperture 120 must be kept small when using the aperture to pass photons. It is however possible to work with larger distance between the aperture and the sample position (a longer so-named working distance) when a high numerical aperture N.A. of the light path is (temporarily) unimportant, e.g. when observing the sample with only the particle beam. It is e.g. possible to image the sample with the particle beam with a large distance between the sample position and the aperture, enabling a large field-of-view and performing e.g. coarse navigation, after which the distance is made smaller and e.g. Raman spectroscopy can be performed on a minute part of the sample.

It is also remarked that the aforementioned embodiments show at most one detector for detecting radiation caused by impinging particles. It is well known that many of these detectors can be present, either in the vacuum chamber, or in the particle-optical column, capable of detecting radiation of different kinds, such as secondary electrons, secondary ions, backscattered electrons, X-rays, etc.

It is further remarked that the aforementioned embodiments describe photons coming from the sample being detected by a photon detector. This is particularly interesting when detecting light emitted as a result of impinging particles (cathodoluminescense). As well-known to the person skilled in the art it is often advantageous to illuminate the sample with photons (to cause certain physical or chemical changes, e.g. due to heating), or even to illuminate the sample with photons while simultaneously detecting photons coming from the sample using e.g. a beam splitter (e.g. Raman spectroscopy). The invention is equally suited for illuminating the sample.

Also remarked is that the pressure in the first volume, where the sample resides, can be adjusted by admitting e.g. air or water vapour to the vacuum chamber via a controlled leak. As known to the person skilled in the art this can be done by admitting the vapour into the chamber or by locally admitting the vapour with the aid of so-named gas injectors close to the sample position. Also the admission of other fluids, such as precursor fluids used for deposition, or of etching fluids used for etching, such as $XeF_2$, is well-known. Instead of water to avoid dehydration of wet samples, other fluids may be admitted to the first volume to avoid evaporation of other fluids in the sample, such as oils, greases, etc. This may be of interest when observing e.g. suspensions of certain drugs in oily 'carriers', or when observing/analysing mixtures containing e.g. oils and catalysts.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim as follows:

1. Particle-optical apparatus comprising:
   a vacuum chamber,
   a particle-optical column mounted on the vacuum chamber for producing a particle beam round a particle-optical axis, said particle-optical column comprising a particle source,
   a sample carrier located in the vacuum chamber for carrying a sample at a sample position, said sample position located on the particle-optical axis, a mirror for collecting light emitted from the sample position or focussing light on the sample position, said mirror showing a through-hole round the particle-optical axis, and evacuation means for evacuating the apparatus, characterized in that a diaphragm is placed between the sample position and the mirror, said diaphragm dividing a first volume within the vacuum chamber in which the sample position is located from a second volume, said diaphragm showing an aperture round the particle-optical axis for passing particles produced by the particle-optical column and for passing light between the mirror and the sample position, the aperture limiting the gas flow from the first volume to the second volume to such a value, that, when the pressure at the sample position is the equilibrium pressure of a fluid with an equilibrium pressure above 1 mbar, the evacuation means can evacuate the second vacuum to a pressure sufficiently low to cause negligible scattering of the particle beam in the second volume when compared to the scattering in the first volume, the distance between the aperture and the sample position can be adjusted to be, or is fixed at, less than four times the diameter of the aperture, and the mirror is located between the diaphragm and the particle source.

2. The particle optical apparatus according to claim 1 in which the distance between the aperture and the sample position can be adjusted to be, or is fixed at, less than twice the diameter of the aperture.

3. The particle optical apparatus according to claim 1 in which the diameter of the aperture is less than 1 mm.

4. The particle optical apparatus according to claim 1 in which the diameter of the aperture is less than 300 µm.

5. The particle optical apparatus according to claim 1 in which the evacuation means can evacuate the second volume to a pressure sufficiently low to cause negligible scattering of the particle beam compared to the scattering occurring in the first vacuum when the pressure in the first volume is above approximately 6 mbar.

6. The particle optical apparatus according to claim 1 further comprising a charged particle detector, said detector located in the second volume.

7. The particle optical apparatus according to claim 1 further comprising a charged particle detector, said detector located in the first volume.

8. The particle optical apparatus according to claim 1 further comprising a charged particle detector, in which the diaphragm is part of said charged particle detector.

9. The particle optical apparatus according to claim 1 further comprising a photon detector for detecting light emanating from the sample position.

10. The particle optical apparatus according to claim 9 further comprising a light block placed on the light-optical path between the photon detector and the mirror, said light block showing a hole for passing light, the mirror imaging the sample position on the hole, as a result of which light emanating from other places than the sample position does not significantly contribute to the amount of light detected by the photon detector.

11. The particle optical apparatus according to claim 1 in which the apparatus is equipped with a gas injector, said gas injector admitting gas or vapour to the first volume.

12. The particle optical apparatus according to claim 1 in which the diaphragm shows a protrusion in the form of a truncated cone pointing to the sample position, and where the aperture is formed in the end of the cone closest to the sample position.

13. The particle optical apparatus according to claim 1 in which the light is formed by photons from the group of infra-red, visible light, ultra-violet and X-ray photons.

14. The particle optical apparatus according to claim 1 claims in which a pole piece of a particle-optical lens is situated between the sample position and the mirror.

15. The particle optical apparatus according to claim 14 in which the pole piece is the diaphragm.

16. The particle optical apparatus according to claim 1 in which the mirror is located between the particle-optical column and the aperture.

17. A Kit for upgrading an existing microscope to a microscope according to claim 1.

18. A method of operating a particle-optical apparatus, the method comprising:
providing an apparatus according to claim 1,
mounting a sample at the sample position,
evacuating the first volume to a pressure between 1-50 mbar,
evacuating the second volume to a pressure below 0.1 mbar
adjusting the distance between the sample and the aperture to a distance less than twice the diameter of the aperture,
passing a beam of particles through the aperture, and
passing a beam of photons through the aperture.

19. The method according to claim 18 in which the beam of photons emanates from the sample.

20. The method according to claim 18 in which the beam of photons is focused on the sample.

21. The method according to claim 18 in which the first volume is evacuated to a pressure between approximately 1 mbar and approximately 20 mbar.

22. The method according to claim 18 in which the first volume is evacuated to a pressure between approximately 6 and approximately 10 mbar.

23. A particle-optical apparatus comprising:
a vacuum chamber;
a particle-optical column mounted on the vacuum chamber for producing a particle beam round a particle-optical axis, said particle-optical column comprising a particle source;
a sample carrier located in the vacuum chamber for carrying a sample at a sample position, said sample position located on the particle-optical axis;
a mirror located between the particle source and the sample position, the mirror for collecting light emitted from the sample position or focussing light on the sample position, and said mirror showing a through-hole around the particle-optical axis;
a pump for evacuating the apparatus;
diaphragm located between the sample position and the mirror, said diaphragm dividing a first volume within the vacuum chamber in which the sample position is located from a second volume, said diaphragm having an aperture for passing particles produced by the particle-optical column and for passing light between the mirror and the sample position, the distance between the aperture and the sample position fixed at, or capable of being adjusted to be, less than four times the diameter of the aperture;
the aperture positioned so that said particle-optical axis passes through the aperture, and the aperture further limiting the gas flow from the first volume to the second volume to such a degree, that, when the pressure at the sample position is at the equilibrium pressure of a fluid with an equilibrium pressure above 1 mbar, the pump can evacuate the second vacuum to a pressure sufficiently low to cause negligible scattering of a particle beam passing through the second volume when compared to the scattering of a particle beam passing through the first volume.

24. The apparatus of claim 23 in which the distance between the aperture and the sample position fixed at, or capable of being adjusted to be, less than two times the diameter of the aperture.

25. A method of operating a particle-optical apparatus, the method comprising:
 (a) providing a particle-optical apparatus comprising:
  (i) a vacuum chamber;
  (ii) a particle-optical column mounted on the vacuum chamber for producing a particle beam round a particle-optical axis, said particle-optical column comprising a particle source;
  (iii) a sample carrier located in the vacuum chamber for carrying a sample at a sample position, said sample position located on the particle-optical axis;
  (iv) a mirror located between the particle source and the sample position, the mirror for collecting light emitted from the sample position or focussing light on the sample position, and said mirror showing a through-hole around the particle-optical axis;
  (v) a pump for evacuating the apparatus;
  (vi) diaphragm located between the sample position and the mirror, said diaphragm dividing a first volume within the vacuum chamber in which the sample position is located from a second volume, said diaphragm having an aperture for passing particles produced by the particle-optical column and for passing light between the mirror and the sample position, the distance between the aperture and the sample position fixed at, or capable of being adjusted to be, less than four times the diameter of the aperture; and
  (vii) the aperture positioned so that said particle-optical axis passes through the aperture, and the aperture further limiting the gas flow from the first volume to the second volume to such a degree, that, when the pressure at the sample position is at the equilibrium pressure of a fluid with an equilibrium pressure above 1 mbar, the pump can evacuate the second vacuum to a pressure sufficiently low to cause negligible scattering of a particle beam passing through the second volume when compared to the scattering of a particle beam passing through the first volume;
 (b) mounting a sample on the sample carrier at the sample position;
 (c) evacuating the first volume to a pressure between 1-50 mbar;
 (d) evacuating the second volume to a pressure below 0.1 mbar;
 (e) adjusting the distance between the sample and the aperture to a distance less than twice the diameter of the aperture;
 (f) passing a beam of particles through the aperture and onto the sample; and
 (g) passing a beam of photons through the aperture.

* * * * *